(12) United States Patent
Nagayama

(10) Patent No.: US 6,828,821 B2
(45) Date of Patent: Dec. 7, 2004

(54) INPUT BUFFER CIRCUIT

(75) Inventor: Atsushi Nagayama, Kanagawa (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 10/157,239

(22) Filed: May 30, 2002

(65) Prior Publication Data
US 2003/0102888 A1 Jun. 5, 2003

(30) Foreign Application Priority Data
Nov. 29, 2001 (JP) ........................................ 2001-363826

(51) Int. Cl.[7] .............................................. H03K 19/23
(52) U.S. Cl. .............................. 326/36; 326/35; 326/34; 326/77
(58) Field of Search ................................ 326/35–36, 17, 326/20, 26, 27, 34, 83, 112, 119, 211, 121

(56) References Cited

U.S. PATENT DOCUMENTS

| | | | | | |
|---|---|---|---|---|---|
| 5,168,176 A | * | 12/1992 | Wanlass | ...................... | 307/443 |
| 5,491,432 A | * | 2/1996 | Wong et al. | .................. | 326/86 |
| 5,910,730 A | * | 6/1999 | Sigal | ............................ | 326/24 |
| 6,570,414 B1 | * | 5/2003 | Eker | ........................... | 327/108 |

* cited by examiner

Primary Examiner—Anh Q. Tran
(74) Attorney, Agent, or Firm—Rabin & Berdo, P.C.

(57) ABSTRACT

An input buffer circuit includes front stage circuits and a succeeding stage circuit. Each of the front stage circuits has a logic threshold voltage different from each other. The succeeding stage circuit has a P type MOS transistor and an N type MOS transistor connected in series. The succeeding circuit includes inputs connected to the front stage circuit. A logic threshold voltage of the succeeding stage circuit is set to be between the respective logic threshold voltages of the front stage circuits.

19 Claims, 5 Drawing Sheets

CIRCUIT OPERATION DURING THE STANDARD PROCESS

CIRCUIT OPERATION WHEN VTACT OF PMOS IS HIGH AND VTACT OF NMOS IS LOW

CIRCUIT OPERATION WHEN VTACT OF PMOS IS LOW AND VTACT OF NMOS IS HIGH

INPUT BUFFER CIRCUIT

BACKGROUND OF THE INVENTION

The invention relates to an input buffer circuitry of an LSI, directly receiving a signal inputted from outside.

The input-output characteristic of CMOS inverters making up an input buffer circuitry indicates how an output voltage varies against an input voltage based on a ratio of β an N type MOS transistor to that of a P type MOS transistor, that is, a β ratio $\beta=\beta_N/\beta_P=\{W$ (gate width)/L (gate length)$\}_N/(W/L)_P$ as a parameter. Herein, a MOS transistor refers to a MOS type transistor such as a MOSFET, and so forth.

Referring to FIG. 8, a case where a β ratio=1, that is, the W/L ratio of an N type MOS transistor is equal to that of a P type MOS transistor is described hereinafter by way of example.

FIG. 8 is an input/output plot of a conventional CMOS inverter.

With an N type MOS transistor wherein a source voltage is 0V when an input voltage Vin is 0V, no conduction exists, and with a P type MOS transistor wherein a source voltage is 5V, conduction occurs because a gate-source voltage is −5V. As a result, an output voltage becomes 5V.

With the N type MOS transistor, conduction starts at a point A where a threshold voltage 0.8V of the N type MOS transistor is exceeded while an input voltage is increased from 0V to 5V (VDD). An output voltage Vout is fully 5V up until then, and there is no direct passing of current between power sources. For a period from the point A to a point B in FIG. 8, the N type MOS transistor operates in the saturation region while the P type MOS transistor operates in the unsaturated region. For a period from the point B to a point D, both the N type MOS transistor and the P type MOS transistor operate in the saturation region, and in this period, the output voltage Vout varies most sharply, and an amplification degree of a small signal is at the maximum. Further, for a period from the point D to a point E between the points A and E, when direct current flows between the power sources, the N type MOS transistor operates in the unsaturated region while the P type MOS transistor operates in the saturation region. Upon the input voltage Vin increasing beyond the point E, a gate-source voltage of the P type MOS transistor becomes greater than −0.8V, and no conduction occurs to the P type MOS transistor, so that there will be no passing of current between the power sources, and the output voltage Vout turns fully 0V.

Now, a point C is a point where Vin becomes equal to Vout, and is called a logic inversion voltage or a logic threshold voltage. Hereinafter, the term "logic threshold voltage" is in use.

According to the industry specification, when a power source voltage $V_{DD}$ is 1.8V, and a ground is at 0V, a range of 0 to 0.63V is designated as a low level while a range of 1.17 to 1.8V is designated as a high level. A range up to 0~0.63V signifies an allowance from 0V, and a range up to 1.17~1.8V signifies an allowance from the power source voltage 1.8V.

It is required as a characteristic of an inverter that both the allowances are to be secured with an adequate margin, respectively. In order to enable both the allowances to be secured with an adequate margin, respectively, even if there occur process variation and so forth, described as a problem with a conventional example, the characteristic of the inverter requires that a circuitry is set such that a range of variation of the logic threshold voltage at the point C is reduced.

An attempt has been made in the past to extend a range of conditions wherein a transition in condition does not occur, that is, a range of stable conditions wherein no current flows, by reducing an input voltage range wherein current flows. As a result, if there occur the process variation and so forth as described in the foregoing, the logic threshold voltage at the point C undergoes a large variation, and consequently, it becomes impossible to secure both the allowances adequately, so that an output against an input pulse at the low level and the high level, respectively, can not be adequately provided.

With a circuitry of such a characteristic as described above, at the time when the process variation, more specifically, variation in the threshold voltage of transistors, variation in process steps, change in temperature, variation in AC voltage, and so forth, becomes greater, resultant variation of the threshold voltage for determining the high level or low level becomes greater, so that there will occur a decrease in an allowance of a high level voltage or a low level voltage, capable of transmitting an input signal, from either the power source voltage or the ground level voltage.

Taking into consideration the process variation, voltage variation, temperature variation, and measurement error of a measuring instrument, there has existed a problem that a constant voltage interface is unable to meet the minimum voltage for an input at the high level and the maximum voltage for an input at the low level, in accordance with the industry's standard specification.

SUMMARY OF THE INVENTION

In view of the problem described above, the invention may provide an input buffer circuit wherein even at the time when process variation becomes greater, resultant variation of a threshold voltage for determining the high level or low level is prevented from becoming greater.

An input buffer circuit of the present invention includes front stage circuits and a succeeding stage circuit. Each of the front stage circuits has a logic threshold voltage different from each other. The succeeding stage circuit has a P type MOS transistor and an N type MOS transistor connected in series. The succeeding circuit includes inputs connected to the front stage circuit. A logic threshold voltage of the succeeding stage circuit is set to be between the respective logic threshold voltages of the front stage circuits.

DETAILED DESCRIPTION OF THE PREFERRED EMBODIMENTS

In order to minimize a range of variation of a logic threshold voltage, and to thereby secure an input buffer having both the previously described allowances with an adequate margin, respectively, the invention provides an input buffer circuitry comprised of inverters configured such that respective outputs of two inverters A and B, provided at a front stage, are separately inputted to respective gates of a P type MOS transistor and an N type MOS transistor, making up an inverter C provided at a succeeding stage, wherein the logic threshold voltages of the respective inverters are set to have a relationship of $V_A<V_C<V_B$ ($V_A$, $V_C$, $V_B$ refer to the logic threshold voltage of the inverter A, B, and C, respectively). Viewed from a different angle, it can be said that providing the P type MOS transistor and N type MOS transistor with an ON/ON period so as to allow current to flow is traded off for a proper logic threshold voltage margin.

Embodiments of the invention are described in detail hereinafter with reference to the accompanying drawings.

Figure 1:
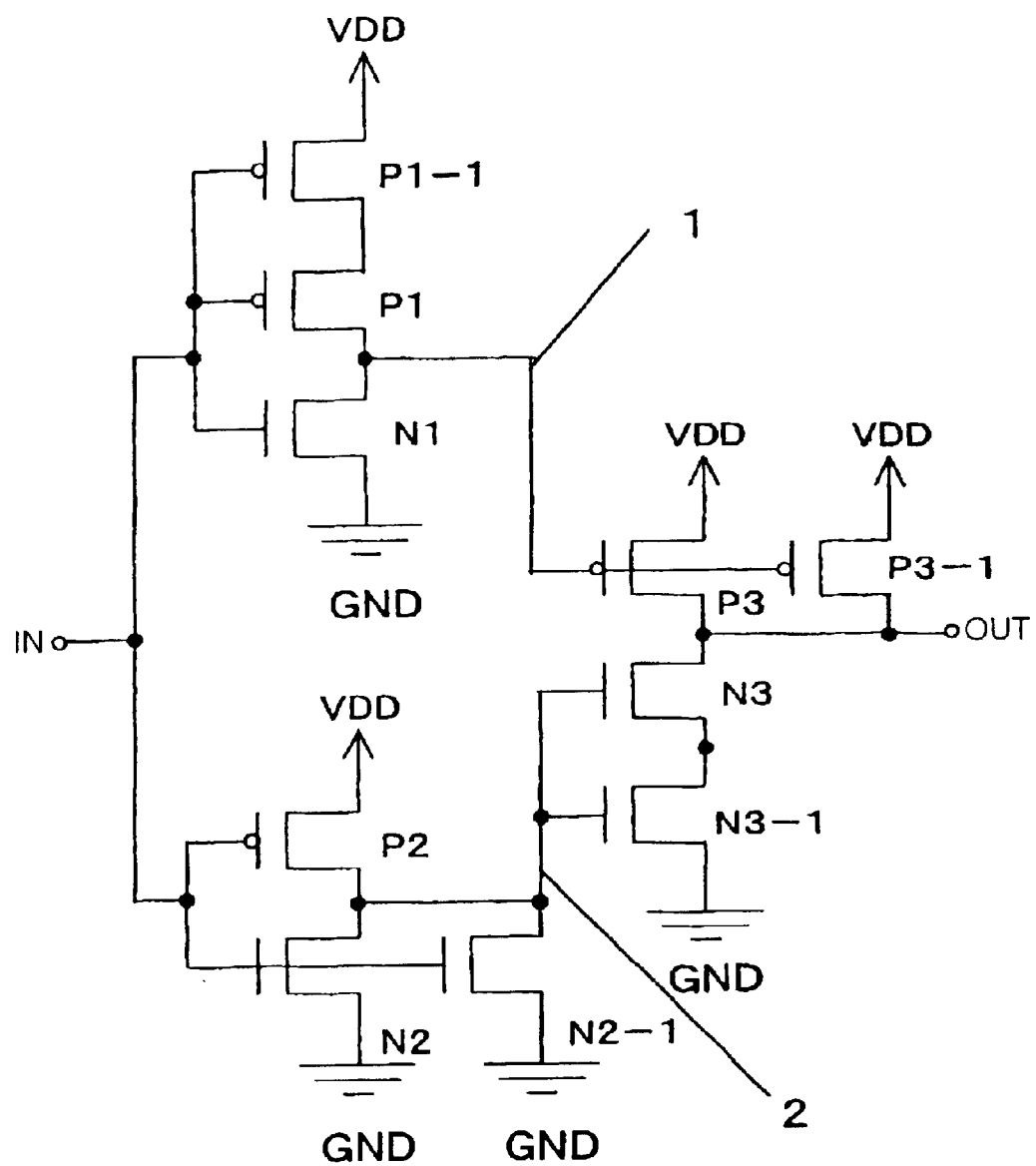
FIG. 1 is a circuit diagram showing a first embodiment of an input buffer circuitry according to the invention.

FIG. 1 is a circuit diagram showing a first embodiment of an input buffer circuitry according to the invention.

An input terminal is connected to respective gates of a P type MOS transistor P1 and an N type MOS transistor N1, making up an inverter, and also to respective gates of a P type MOS transistor P2 and an N type MOS transistor N2, making up an inverter.

A connection node 1 between respective drains of the P type MOS transistor P1 and the N type MOS transistor N1, and a connection node 2 between respective drains of the P type MOS transistor P2 and the N type MOS transistor N2 are connected to a gate of a P type MOS transistor P3, and a gate of an N type MOS transistor N3, respectively, and respective drains of the P type MOS transistor P3 and the N type MOS transistor N3 are connected to an output terminal.

In this circuitry, a logic threshold voltage of a circuit made up of the P type MOS transistor P1 and the N type MOS transistor N1 is set so as to be lower than a logic threshold voltage of a circuit made up of the P type MOS transistor P3 and the N type MOS transistor N3 while a logic threshold voltage of a circuit made up of the P type MOS transistor P2 and the N type MOS transistor N2 is set so as to be higher than the logic threshold voltage of the circuit made up of the P type MOS transistor P3 and the N type MOS transistor N3.

Assuming that a logic threshold voltage level of an inverter made up of the P type MOS transistor P1 and the N type MOS transistor N1 is referred to as A, and a logic threshold voltage level of an inverter made up of the P type MOS transistor P2 and the N type MOS transistor N2 is referred to as B, description will be given hereinafter.

Figure 2:
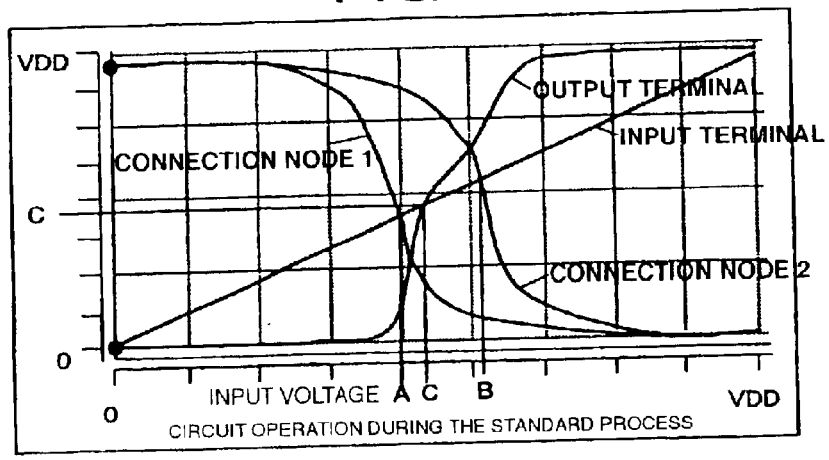
FIG. 2 is a diagram showing circuit operation during the standard process according to the first embodiment of the invention.

FIG. 2 is a diagram showing circuit operation during the standard process according to the first embodiment of the invention.

In the figure, a characteristic curve of the connection node 1 shows a characteristic of voltage at the connection node 1 in FIG. 1 relative to an input voltage while a characteristic curve of the connection node 2 shows a characteristic of voltage at the connection node 2 in FIG. 1 relative to the input voltage. A characteristic straight line of the input terminal shows the characteristic of the input voltage, and a characteristic curve of the output terminal shows a characteristic of voltage at the output terminal in FIG. 1.

In the figure, a point "A" is the intersection between the characteristic curve of the connection node 1 and the characteristic straight line of the input terminal. In the figure, a point "B" is the intersection between the characteristic curve of the connection node 2 and the characteristic straight line of the input terminal. In the figure, a point "C" is the intersection between the characteristic curve of the output terminal and the characteristic straight line of the input terminal.

When the input voltage is in a range corresponding to a range of the output voltage according to the characteristic curves of the connection node 1 and the connection node 2, respectively, where the output voltage is other than $V_{DD}$ and 0V, that is, a period of time when the input voltage is between divisions 2 and 7 (in the figure) represents a transition period, thereby allowing current to flow.

It is assumed that a relationship of the respective logic threshold voltages is represented by A<C<B, that is, the input voltage is set such that $V_A<V_C<V_B$.

With an input voltage level in a range of from 0 to A in FIG. 2, the P type MOS transistor P1 and the N type MOS transistor N1 reach the logic threshold value at a lower input voltage in comparison with the P type MOS transistor P2 and the N type MOS transistor N2, so that the P type MOS transistor P3 maintains a high resistance condition, and the N type MOS transistor N3 is in the middle of transition to a low resistance condition, causing an output voltage level to be at a fairly low voltage. Further, with the input voltage level in a range of from B to $V_{DD}$, the P type MOS transistor P3 is in a low resistance condition, and the N type MOS transistor N3 is in the middle of transition from a low resistance condition to a high resistance condition, so that the output voltage level is at a fairly high voltage. When the input voltage level rises from A to B, the P type MOS transistor P3 starts transition to the low resistance condition, and the N type MOS transistor N3 is about to start transition from the low resistance condition to the high resistance condition. When the input voltage is falling, the P type MOS transistor P3 is about to start transition from the low resistance condition to the high resistance condition while the N type MOS transistor N3 is about to start transition to the low resistance condition, and at a point C, the P type MOS transistor P3 and the N type MOS transistor N3 will have a resistance ratio such that an input voltage value becomes equal to an output voltage value. The input voltage at the point C represents the logic threshold voltage Vt.

Now, referring to FIG. 3, circuit operation during process variation is described hereinafter.

Figure 3:
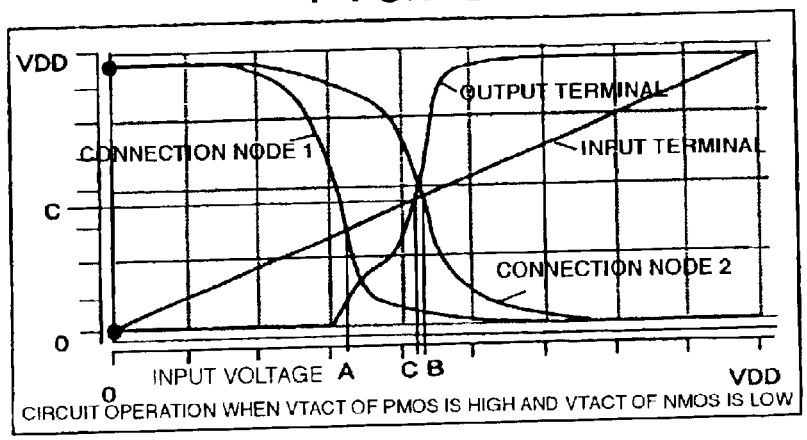
FIG. 3 is a diagram showing circuit operation at the time when a threshold voltage |Vtact| of a P type MOS transistor according to the first embodiment of the invention turns high while a threshold voltage |Vtact| of a N type MOS transistor according to the first embodiment turns low.

FIG. 3 is a diagram showing circuit operation at the time when a threshold voltage |Vtact| of the P type MOS transistor according to the first embodiment of the invention turns high while a threshold voltage |Vtact| of the N type MOS transistor according to the first embodiment of the invention turns low.

When the threshold voltage |Vtact| of the P type MOS transistor rises and the threshold voltage |Vtact| of the N type MOS transistor falls due to process variation, both a voltage at a point A and a voltage at a point B fall, however, because a range becomes wider wherein the P type MOS transistor maintains a high resistance condition with the input voltage between A to B, a matching voltage at a point C moves closer to a voltage at the point B, so that a difference in voltage between B and C, prior to the process variation, can be reduced to a smaller range.

Figure 4:
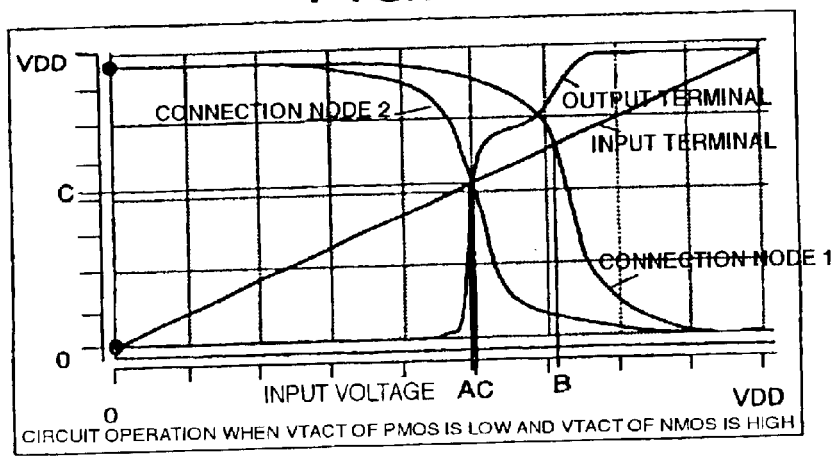
FIG. 4 is a diagram showing circuit operation at the time when the threshold voltage |Vtact| of the P type MOS transistor according to the first embodiment turns low while the threshold voltage |Vtact| of the N type MOS transistor according to the first embodiment turns high.

FIG. 4 is a diagram showing circuit operation at the time when the threshold voltage |Vtact| of the P type MOS transistor according to the first embodiment of the invention turns low while the threshold voltage |Vtact| of the N type MOS transistor according to the first embodiment of the invention turns high.

When the threshold voltage |Vtact| of the P type MOS transistor falls and the threshold voltage |Vtact| of the N type MOS transistor rises, both a voltage at the point A and a voltage at the point B rise, however, because a range becomes wider wherein the N type MOS transistor maintains the high resistance condition with the input voltage between A to B, a matching voltage at the point C moves closer to a voltage at the point A, so that a difference in voltage between A and C, prior to the process variation, can be reduced to a smaller range.

As shown in Table 1, with the use of the circuitry of the configuration according to the first embodiment of the invention, it is possible to obtain an advantageous effect that variation of the logic threshold voltage for determining whether an input buffer is at the high level or the low level can be held down to a small range even it there occurs the process variation.

More specifically, as shown in Table 1, in contrast with a conventional circuitry wherein a logic threshold voltage is in a range of 0.689 to 1.062, the circuitry according to the invention has the logic threshold voltage in a range of 0.809 to 1.005, narrower than the range of the former.

TABLE 1

LOGIC THRESHOLD VOLTAGES DUE TO PROCESS VARIATION

| PMOS Vtact | NMOS Vtact | Voltage (V) | Temperature (° C.) | Invention circuit | Conventional circuit |
|---|---|---|---|---|---|
| max. | min. | 1.8 | 25 | 0.809 | 0.689 |
| standard | | 1.8 | 25 | 0.862 | 0.868 |
| min. | max. | 1.8 | 25 | 1.005 | 1.062 |

Figure 5:
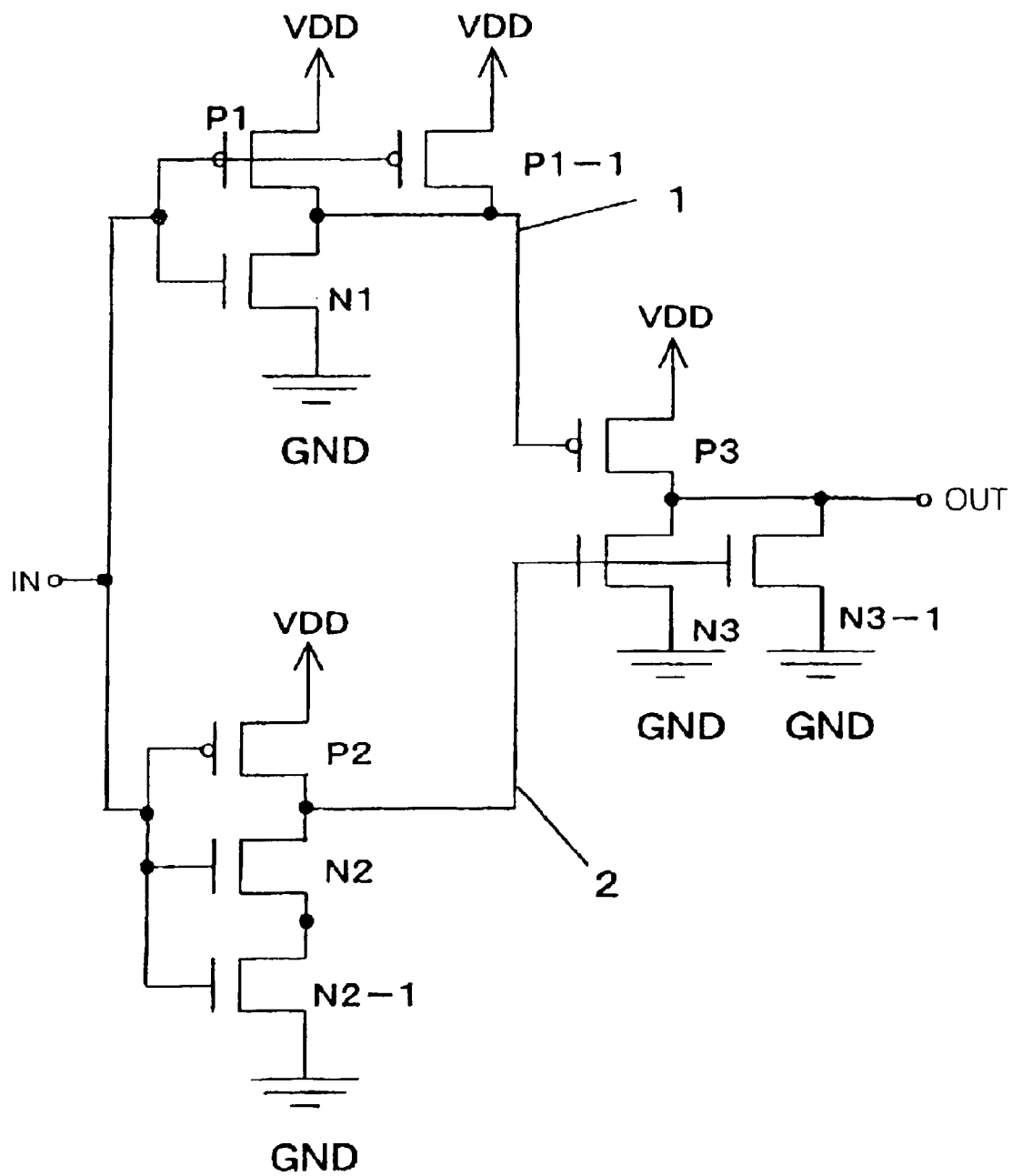
FIG. 5 is a diagram showing a circuitry example 1 of a second embodiment of an input buffer circuitry according to the invention.

FIG. 5 is a diagram showing a circuitry example 1 of a second embodiment of an input buffer circuitry according to the invention.

Figure 6:
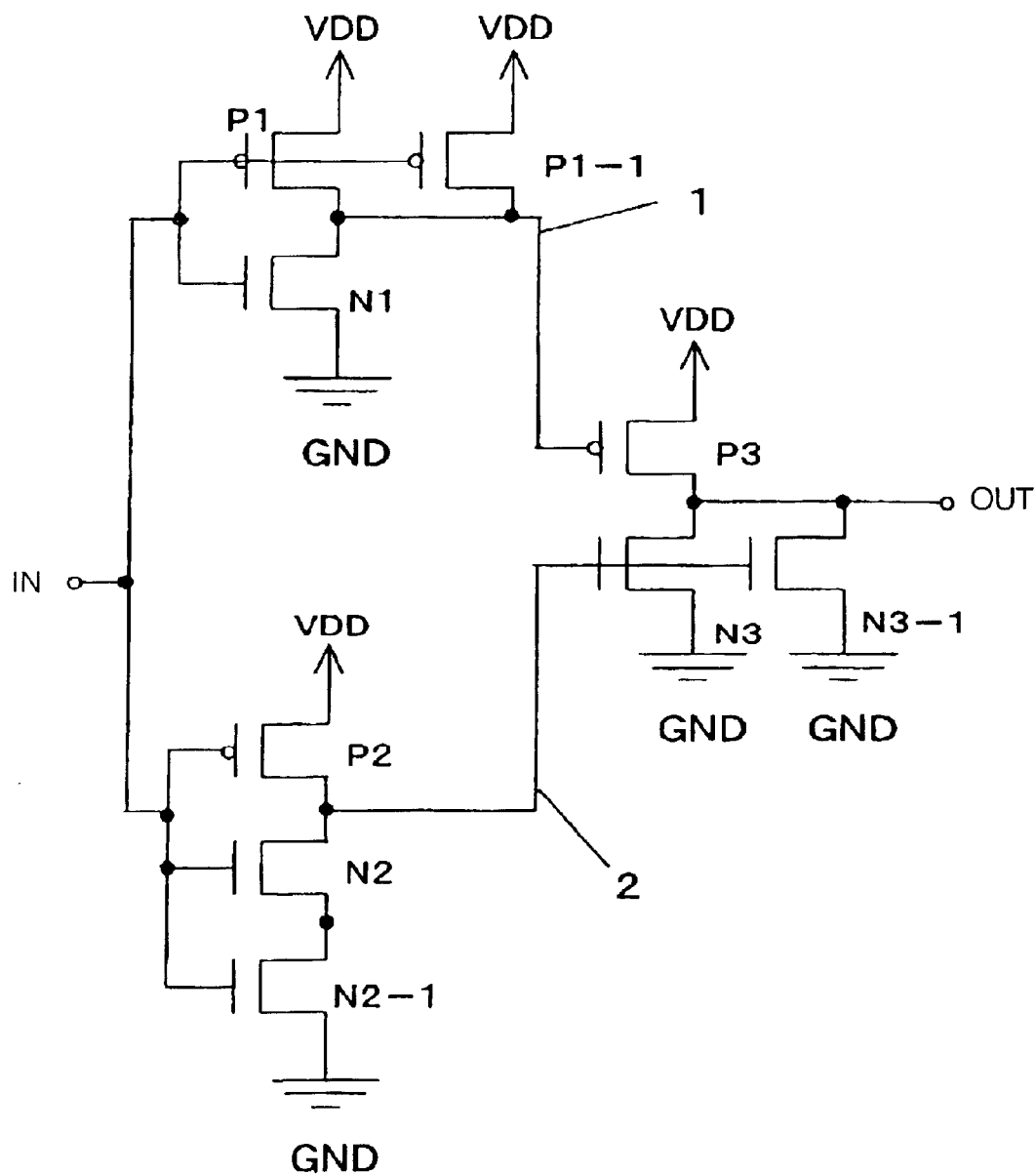
FIG. 6 is a diagram showing a circuitry example 2 of the second embodiment of the input buffer circuitry according to the invention.

FIG. 6 is a diagram showing a circuitry example 2 of the second embodiment of the input buffer circuitry according to the invention.

The circuitry example 1 shown in FIG. 5 is made up of a series connection of a P type MOS transistor P1, and a P type MOS transistor P1-1 in place of the P type MOS transistor P1 according to the first embodiment in FIG. 1, a parallel connection of a N type MOS transistor N2 and a N type MOS transistor N2-1 in place of the N type MOS transistor N2 according to the first embodiment, a parallel connection of a P type MOS transistor P3, and a P type MOS transistor P3-1 in place of the P type MOS transistor P3 according to the first embodiment, and a series connection of a N type MOS transistor N3 and a N type MOS transistor N3-1 in place of the N type MOS transistor N3 according to the first embodiment.

The circuitry example 2 shown in FIG. 6 is made up of a parallel connection of a P type MOS transistor P1, and a P type MOS transistor P1-1 in place of the P type MOS transistor P1 according to the first embodiment in FIG. 1, a series connection of a N type MOS transistor N2 and a N type MOS transistor N2-1 in place of the N type MOS transistor N2 according to the first embodiment, and a parallel connection of a N type MOS transistor N3 and a N type MOS transistor N3-1 in place of the N type MOS transistor N3 according to the first embodiment.

Thus, with the circuitry examples 1 and 2, according to the second embodiment of the invention, an input buffer circuitry is made up by implementing series connection or parallel connection, and combination of series connection and parallel connection of MOS transistors each with a gate length and gate width differing from those for the first embodiment in place of the respective MOS transistors according to the first embodiment, that is, the P type MOS transistors P1, P2, and P3, and the N type MOS transistors N1, N2, and N3.

In FIG. 5, transistors in series connection, comprising the P type MOS transistor P1, and the P type MOS transistor P1-1, transistors in parallel connection, comprising the N type MOS transistor N2 and the N type MOS transistor N2-1, and transistors in parallel connection, comprising the P type MOS transistor P3, and the P type MOS transistor P3-1, perform the same functions as those of the P type MOS transistor P1, the N type MOS transistor N2, and the P type MOS transistor P3 as described in the first embodiment, respectively.

Further, in FIG. 6, transistors in parallel connection, comprising, the P type MOS transistor P1, and the P type MOS transistor P1-1, transistors in series connection, comprising the N type MOS transistor N2 and the N type MOS transistor N2-1, and transistors in parallel connection, comprising the N type MOS transistor N3 and the N type MOS transistor N3-1, perform the same functions as those of the P type MOS transistor P1, the N type MOS transistor N2, and the N type MOS transistor N3 as described in the first embodiment, respectively. The operation of both the circuitry example 1 and the circuitry example 2 is therefore the same as that for the first embodiment.

Even if a combination of series connection and parallel connection of MOS transistors is adopted for constituent elements of the respective inverters, this will cause no problem as long as expected characteristics are obtained.

The second embodiment has an advantageous effect in addition to the advantageous effect of the first embodiment in that the former can be applied to a case where transistors of the same size are used as with the case of a gate array.

With the input buffer circuitry according to the first and second embodiments of the invention, respectively, use is made of inverter circuits, however, it is also possible to implement the input buffer circuitry by use of other logic gates such as NAND circuits, AND circuits, and so forth.

Figure 7:
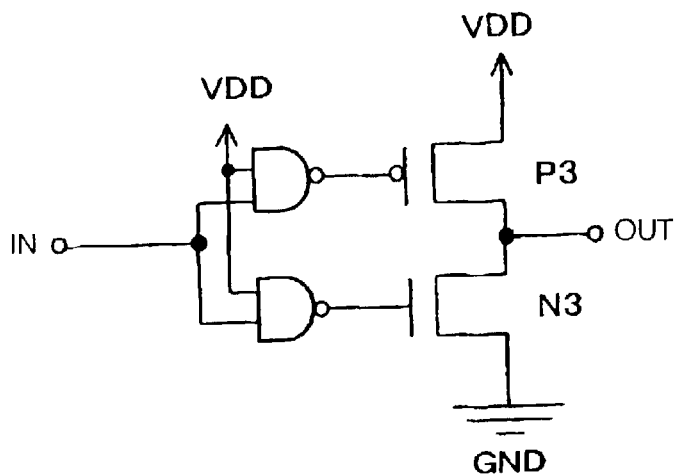
FIG. 7 is a block diagram showing an example of the input buffer circuitry according to the invention, comprising NAND circuits.
Figure 8:
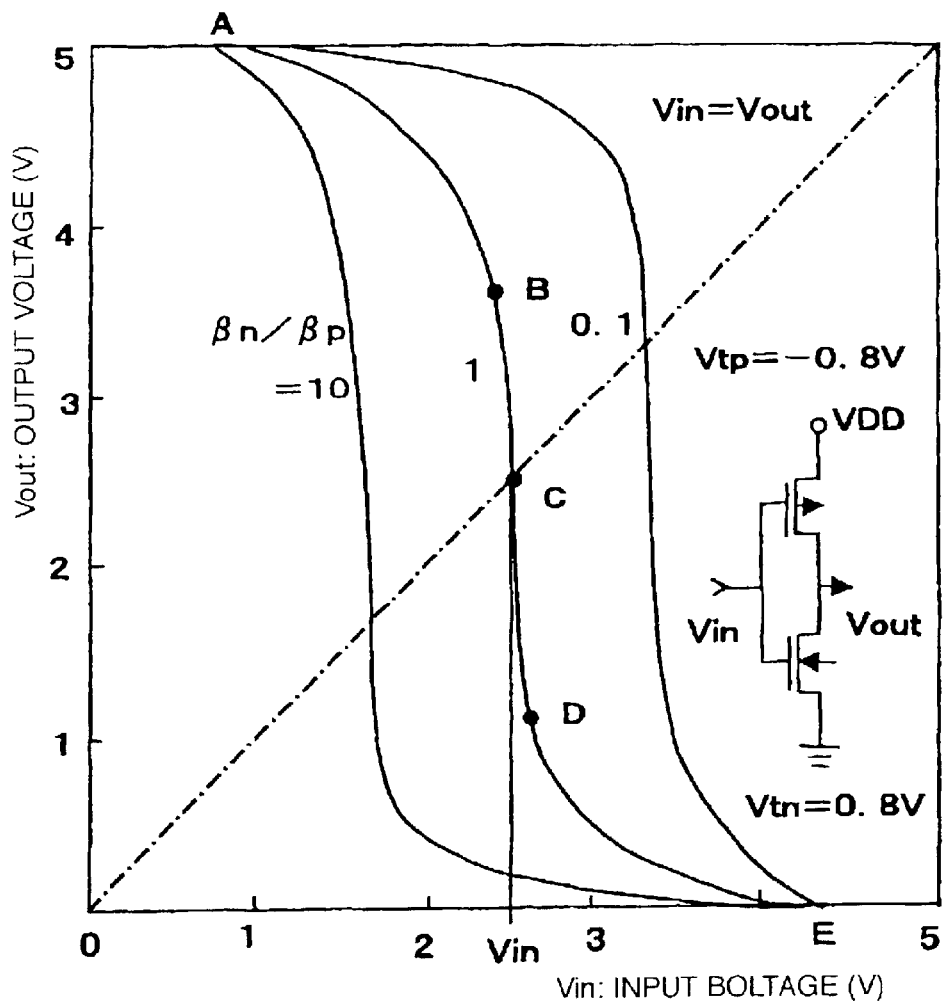
FIG. 8 is an input/output plot of a conventional CMOS inverter.

FIG. 7 is a block diagram showing an example of the input buffer circuitry according to the invention, comprising NAND circuits.

A circuitry in FIG. 7 has a configuration wherein an output terminal of a NAND circuit receiving an input signal and a power source voltage, respectively, in place of the inverter circuit at the front stage in FIG. 1, is connected to the gate of the P type MOS transistor P3 in FIG. 1, and an output terminal of a NAND circuit receiving the input signal and the power source voltage, respectively, in place of the other inverter circuit in the front stage in FIG. 1, is connected to the gate of the N type MOS transistor N3 in FIG. 1.

With this circuitry of the invention, variation of the logic threshold voltage for determining whether an input buffer is at the high level or the low level can be held down to a small range even if there occurs process variation.

What is claimed is:

1. An input buffer circuit comprising:
   an input terminal for receiving an input signal;
   a first front stage circuit connected to the input terminal, the first front stage circuit having a first logic threshold voltage;
   a second front stage circuit connected to the input terminal, the second front stage circuit having a second logic threshold voltage that is higher than the first logic threshold voltage; and
   a succeeding stage circuit having a P type MOS transistor with a gate terminal that is connected to the first front stage circuit and an N type MOS transistor with a gate terminal that is connected to the second front stage circuit, the MOS transistors being connected in series,
   wherein the succeeding stage circuit has a logic threshold voltage that is set to be between the first and second logic threshold voltages, and
   wherein both MOS transistors of the succeeding stage circuit are in a conducting state when the input signal is at the logic threshold voltage of the succeeding stage circuit.

2. An input buffer circuit according to claim 1, wherein the front stage circuits are inverters.

3. An input buffer circuit according to claim 1, wherein the front stage circuits are comprised of a plurality of MOS transistors.

4. An input buffer circuit according to claim 2, wherein the respective inverters are comprised of a plurality of MOS transistors connected in series or parallel.

5. An input buffer circuit according to claim 1, wherein the front stage circuits are AND circuits or NAND circuits, and respective outputs thereof are inputted to respective gates of the P type MOS transistor and the N type MOS transistor.

6. An input buffer circuit according to claim 1, wherein the front stage circuits and the succeeding stage circuits are composed of a plurality of MOSFETs.

7. An input buffer circuit comprising:
   an input signal for receiving an input signal;
   a first logic circuit connected to the input terminal, the first logic circuit having a first threshold voltage, and including a first output terminal;
   a second logic circuit connected to the input terminal, the second logic circuit having a second threshold voltage that is lower than the first threshold voltage, and including a second output terminal; and
   a third logic circuit which generates an output signal and which has a first input terminal for providing a ground voltage as the output signal connected to the first output terminal, and a second input terminal for providing a power source voltage as the output signal connected to the second output terminal, the third logic circuit having a third threshold voltage that is lower than the first threshold voltage and is higher than the second threshold voltage,
   wherein the third logic circuit comprises a plurality of MOS transistors that are in a conducting state when the input signal is at the third threshold voltage.

8. An input buffer circuit according to claim 7, wherein the first and second logic circuits are inverters.

9. An input buffer circuit according to claim 7, wherein the first and second logic circuits are NAND circuits.

10. An input buffer circuit according to claim 7, wherein the third logic circuit is an inverter.

11. An input buffer circuit according to claim 7, wherein the first logic circuit has a first transistor of a first conductivity type, a second transistor of the first conductivity type and a third transistor of a second conductivity type, all of which are connected in series, and wherein gates of the first to third transistors are connected together.

12. An input buffer circuit according to claim 7, wherein the second logic circuit has a first transistor of a first conductivity type, a second transistor of a second conductivity type and a third transistor of the second conductivity type,
   wherein the first and second transistors are connected in series and the third transistor is connected in parallel with the second transistor, and
   wherein gates of the first to third transistors are connected together.

13. An input buffer circuit according to claim 7, wherein the third logic circuit has a first transistor of a first conductivity type, a second transistor of the first conductivity type, a third transistor of a second conductivity type and a fourth transistor of the second conductivity type,
   wherein the first and second transistors are connected in parallel and the third and fourth transistors are connected in series, and
   wherein gates of the first and second transistors are connected to the first input terminal and gates of the third and fourth transistors are connected to the second input terminal.

14. An input buffer circuit according to claim 7, wherein the first logic circuit has a first transistor of a first conductivity type, a second transistor of the first conductivity type and a third transistor of a second conductivity type,
   wherein the first and third transistors are connected in series and the second transistor is connected in parallel with the first transistor, and
   wherein gates of the first to third transistors are connected together.

15. An input buffer circuit according to claim 7, wherein the second logic circuit has a first transistor of a first conductivity type, a second transistor of a second conductivity type and a third transistor of the second conductivity type, all of which are connected in series, and wherein gates of the first to third transistors are connected together.

16. An input buffer circuit according to claim 7, wherein the first logic circuit has a first transistor of a first conductivity type having a gate connected to a first input terminal, a second transistor of a first conductivity type having a gate connected to the second input terminal and a third transistor of the second conductivity type connected in parallel with the second transistor, and
   wherein a gate of the third transistor is connected to the first input terminal.

17. An input buffer circuit comprising:
   a power supply voltage source;
   a reference voltage source;
   an input terminal receiving an input signal;
   an output terminal outputting an output signal;
   a PMOS transistor having a source connected to the power supply source, a drain connected to the output terminal and a gate connected to receive the input signal; and
   an NMOS transistor having a source connected to the reference voltage source, a drain connected to the output terminal and a gate connected to receive the input signal;

wherein both of the PMOS and NMOS transistors are intentionally in an ON state when the input signal is substantially at a threshold voltage.

18. An input buffer circuit according to claim 17, wherein the gate of the PMOS transistor is connected to the input terminal through an inverter.

19. An input buffer circuit according to claim 17, wherein the gate of the NMOS transistor is connected to the input terminal through an inverter.

* * * * *